(12) United States Patent
Ikada (10) Patent No.: US 10,116,284 B2
(45) Date of Patent: Oct. 30, 2018

(54) BRANCHING DEVICE

(71) Applicant: Murata Manufacturing Co., Ltd., Kyoto (JP)

(72) Inventor: Katsuhiro Ikada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 128 days.

(21) Appl. No.: 15/185,585

(22) Filed: Jun. 17, 2016

(65) Prior Publication Data

US 2016/0301379 A1 Oct. 13, 2016

Related U.S. Application Data

(63) Continuation of application No. PCT/JP2014/083824, filed on Dec. 22, 2014.

(30) Foreign Application Priority Data

Dec. 27, 2013 (JP) .................................. 2013-271056

(51) Int. Cl.
*H03H 9/70* (2006.01)
*H04B 1/00* (2006.01)
(Continued)

(52) U.S. Cl.
CPC .............. *H03H 9/70* (2013.01); *H01P 1/213* (2013.01); *H01P 1/38* (2013.01); *H01Q 1/50* (2013.01);
(Continued)

(58) Field of Classification Search
CPC .. H01P 1/213; H01P 1/38; H01Q 1/50; H03H 7/0161; H03H 7/03; H03H 7/38;
(Continued)

(56) References Cited

U.S. PATENT DOCUMENTS 7,522,016 B2   4/2009   Toncich
2005/0197095 A1   9/2005   Nakamata
(Continued)

FOREIGN PATENT DOCUMENTS

DE   10 2005 010 773 A1   11/2005
DE   11 2011 105 649 T5   8/2014
(Continued)

OTHER PUBLICATIONS

International Search Report issued in Application No. PCT/JP2014/083824 dated Feb. 24, 2015.
(Continued)

*Primary Examiner* — Benny Lee
*Assistant Examiner* — Jorge Salazar, Jr.
(74) *Attorney, Agent, or Firm* — Pearne & Gordon LLP (57) ABSTRACT

A branching device (10) includes a switch (SW1), a fixed filter circuit (11), and a tunable filter (TF1). The switch (SW1) includes a common terminal (Ps11) and individual terminals (Ps12, Ps13). The fixed filter circuit (11) is connected to the individual terminal (Ps12) and has a fixed pass band. The tunable filter (TF1) is connected to the individual terminal (Ps13) and has a tunable pass band. The fixed filter circuit (11) includes filters (FIL1, FIL2) having different pass bands. The pass bands of the filters (FIL1, FIL2) correspond to frequency bands to be used in carrier aggregation.

20 Claims, 5 Drawing Sheets

(51) Int. Cl.
*H01P 1/213* (2006.01)
*H01P 1/38* (2006.01)
*H01Q 1/50* (2006.01)
*H03H 7/01* (2006.01)
*H03H 7/03* (2006.01)
*H03H 7/38* (2006.01)
*H03H 7/46* (2006.01)
*H03H 9/56* (2006.01)
*H03H 9/60* (2006.01)
*H03H 9/64* (2006.01)

(52) U.S. Cl.
CPC ............ *H03H 7/0161* (2013.01); *H03H 7/03* (2013.01); *H03H 7/38* (2013.01); *H03H 7/465* (2013.01); *H03H 7/468* (2013.01); *H04B 1/006* (2013.01); *H04B 1/0057* (2013.01); *H03H 9/568* (2013.01); *H03H 9/605* (2013.01); *H03H 9/6483* (2013.01); *H03H 2210/025* (2013.01); *H03H 2250/00* (2013.01)

(58) Field of Classification Search
CPC .. H03H 7/465; H03H 7/468; H03H 2210/025; H03H 2250/00; H03H 9/568; H03H 9/605; H03H 9/6483; H03H 9/70; H03H 9/703; H03H 9/72; H04B 1/0057; H04B 1/006
USPC ......................... 333/133, 193–196, 187, 188
See application file for complete search history.

(56) References Cited

U.S. PATENT DOCUMENTS

| 2007/0030095 | A1* | 2/2007 | Hikita ................ H03H 9/706 333/133 |
| 2012/0112853 | A1 | 5/2012 | Hikino |
| 2012/0286900 | A1* | 11/2012 | Kadota ............. H03H 9/02559 333/188 |
| 2012/0306591 | A1 | 12/2012 | Nishihara |
| 2014/0169422 | A1 | 6/2014 | Hayafuji |
| 2014/0329475 | A1 | 11/2014 | Ella |

FOREIGN PATENT DOCUMENTS

| JP | 2006-129419 A | 5/2006 |
| JP | 2012-100180 A | 5/2012 |
| JP | 2012-253497 A | 12/2012 |
| JP | 2013-239839 A | 11/2013 |
| JP | 2014-526847 A | 10/2014 |
| WO | 2012/011309 A1 | 1/2012 |
| WO | 2013/027580 A1 | 2/2013 |

OTHER PUBLICATIONS

Written Opinion issued in Application No. PCT/JP2014/083824 dated Feb. 24, 2015.
Notification of Preliminary Rejection issued in Korean Patent Application No. 10-2016-7016455 dated Aug. 11, 2017.
Office action issued in German Patent Application No. 11 2014 006 059.3 dated Sep. 14, 2017.

* cited by examiner

BRANCHING DEVICE

FIELD OF THE DISCLOSURE

The present disclosure relates to branching devices each including a tunable filter.

DESCRIPTION OF THE RELATED ART

A tunable duplexer disclosed in Patent Document 1 is an example of a prior art branching device. The tunable duplexer includes a tunable filter for transmission and a tunable filter for reception. The tunable filter for transmission is connected between an antenna and a transmitter. The tunable filter for reception is connected between the antenna and a receiver. The tunable duplexer, the transmitter, and the receiver constitute a wireless communication device. Such configuration enables transmission and reception at a plurality of frequency bands.

Patent Document 1: U.S. Pat. No. 7,522,016 Specification

BRIEF SUMMARY OF THE DISCLOSURE

These days, in the field of wireless communication equipment typified by cellular phones, carrier aggregation is being put into practical use to meet an increase in data transfer volume. This carrier aggregation enables transmission or reception at a plurality of frequency bands simultaneously.

In order to make the wireless communication device described in Patent Document 1 compatible with the carrier aggregation, a plurality of tunable filters for transmission and a plurality of tunable filters for reception are needed for transmitting and receiving at the plurality of frequency bands simultaneously. This complicates the controls of the tunable filters for transmission and the tunable filters for reception. Furthermore, in general, the tunable filter has an inferior filter characteristic, compared with a filter whose filter characteristic is fixed. Thus, it is possible that the tunable filters for transmission and the tunable filters for reception cannot meet the specifications required for the carrier aggregation. Here, the filter characteristic may be a bandpass characteristic, an attenuation characteristic, or the like.

An object of the present disclosure is to provide a frequency tunable branching device that is compatible with the carrier aggregation while being simple to control or having a simple circuit configuration.

(1) A branching device of the present disclosure includes a switch, a fixed filter circuit, and a tunable filter circuit. The switch includes a common terminal, a first individual terminal, and a second individual terminal. The fixed filter circuit is connected to the first individual terminal and has a fixed pass band. The tunable filter circuit is connected to the second individual terminal and has a tunable pass band. The fixed filter circuit includes a plurality of filters having different pass bands. The pass bands of the plurality of filters correspond to frequency bands to be used in carrier aggregation.

According to this configuration, the tunable filter circuit is used when only a single frequency band is used for transmission or reception. In a case that the carrier aggregation is carried out, the fixed filter circuit is used. The fixed filter circuit has a fixed pass band and therefore can meet the desired filter characteristics for the carrier aggregation. This allows the realization of frequency tunable branching device compatible with the carrier aggregation. Furthermore, the branching device does not require a plurality of tunable filters. This allows the simplification of the control or circuit configuration of the branching device.

(2) Optionally, the fixed filter circuit includes a matching circuit connected between the filters and the first individual terminal.

According to this configuration, the fixed filter circuit side and the switch side may be matched. This improves characteristics of the branching device. This configuration is particularly effective in a case where three or more fixed filter circuits are included.

(3) Optionally, the pass band of at least one of the plurality of filters at least partially overlaps the pass band of the tunable filter circuit.

According to this configuration, the carrier aggregation can be carried out using a frequency band included in the tunable range of the tunable filter circuit.

(4) Optionally, the branching device of the present disclosure is configured as follows. The fixed filter circuit includes a first circulator. The plurality of filters includes a plurality of first filters and a plurality of second filters. The first filter and the second filter are connected to different terminals of the first circulator.

According to this configuration, the transmission side and the reception side are isolated by the first circulator. This enables the carrier aggregation at the transmission side and the reception side simultaneously.

(5) Optionally, the common terminal is connected to an antenna via a second circulator.

According to this configuration, the transmission side and the reception side are isolated by the second circulator. This enables simultaneous transmission and reception.

(6) Optionally, a branching device of the present disclosure is configured as follows. The branching device includes two branching devices according to any one of (1) to (4). The common terminals of the two branching devices are connected to different terminals of a third circulator and connected to an antenna via the third circulator.

According to this configuration, the transmission side and the reception side are isolated by the third circulator. This enables the carrier aggregation at the transmission side and the reception side simultaneously.

(7) Optionally, the tunable filter circuit includes a piezoelectric resonator and a variable reactance element.

According to this configuration, a tunable filter circuit with low insertion loss can be realized.

The present disclosure allows the realization of a frequency tunable branching device that is compatible with the carrier aggregation while being simple to control or having a simple circuit configuration.

DETAILED DESCRIPTION OF THE DISCLOSURE

<<First Embodiment>>

Figure 1:
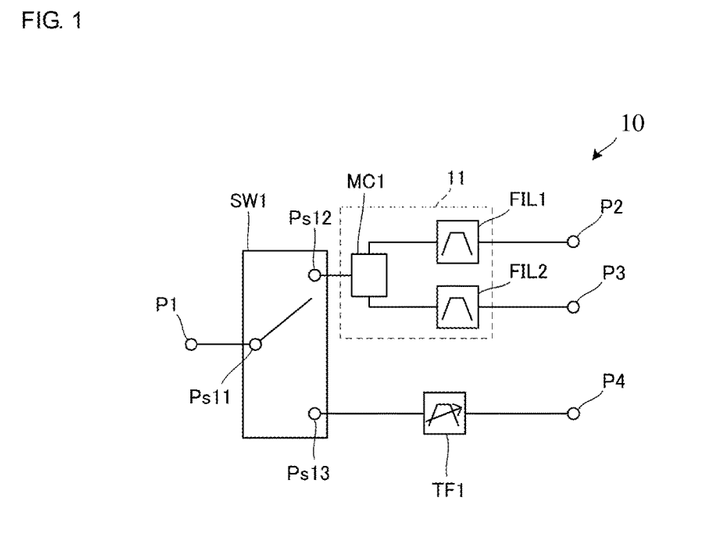
FIG. 1 is a circuit diagram of a branching device 10 according to a first embodiment.

A branching device 10 according to the first embodiment of the present disclosure is now described. FIG. 1 is a circuit diagram of the branching device 10. The branching device 10 includes a switch SW1, a fixed filter circuit 11, a tunable filter TF1, and terminals P1 to P4.

The switch SW1 includes a common terminal Ps11 and individual terminals Ps12 and Ps13. The individual terminal Ps12 corresponds to a first individual terminal of the present disclosure. The individual terminal Ps13 corresponds to a second individual terminal of the present disclosure. The common terminal Ps11 of the switch SW1 is connected to either the individual terminal Ps12 or the individual terminal Ps13 of the switch SW1 in response to control. The common terminal Ps11 of the switch SW1 is connected to the terminal P1. The individual terminal Ps12 of the switch SW1 is connected to the terminals P2 and P3 via the fixed filter circuit 11. The individual terminal Ps13 of the switch SW1 is connected to the terminal P4 via the tunable filter TF1.

The terminal P1 is connected to an antenna (not illustrated). The terminals P2 to P4 are connected to a transmission control unit or a reception control unit (not illustrated). Frequency bands to be used in carrier aggregation are allocated to the terminals P2 and P3. A preset frequency band other than the frequency bands to be used in the carrier aggregation is allocated to the terminal P4.

The fixed filter circuit 11 includes filters FIL1 and FIL2 and a matching circuit MC1. First terminals of the filters FIL1 and FIL2 are connected to the individual terminal Ps12 of the switch SW1 via the matching circuit MC1. A second terminal of the filter FIL1 is connected to the terminal P2. A second terminal of the filter FIL2 is connected to the terminal P3.

Frequency ranges of pass bands and attenuation bands of the filters FIL1 and FIL2 are fixed (not variable). The frequency range of the pass band of the filter FIL1 does not overlap (is different from) the frequency range of the pass band of the filter FIL2. In a case that a received signal is inputted from the individual terminal Ps12 of the switch SW1 to the terminals P2 and P3, the filter FIL1 side is nearly open at a frequency within the pass band of the filter FIL2 when the filter FIL1 side is seen from the individual terminal Ps12 via the matching circuit MC1, and the filter FIL2 side is nearly open at a frequency within the pass band of the filter FIL1 when the filter FIL2 side is seen from the individual terminal Ps12 via the matching circuit MC1.

Furthermore, in a case that transmitting signals are outputted from the terminals P2 and P3 to the individual terminal Ps12, the filter FIL1 side is nearly open at a frequency within the pass band of the filter FIL2 when the filter FIL1 side is seen from the filter FIL2 side via the matching circuit MC1, and the filter FIL2 side is nearly open at a frequency within the pass band of the filter FIL1 when the filter FIL2 side is seen from the filter FIL1 side via the matching circuit MC1.

The bandpass characteristic of the filter FIL1 meets the specifications required for the frequency band to be allocated to the terminal P2. The bandpass characteristic of the filter FIL2 meets the specifications required for the frequency band to be allocated to the terminal P3. In other words, the bandpass characteristics of the filters FIL1 and FIL2 meet the specifications required for frequency bands to be used in the carrier aggregation.

The fixed filter circuit 11 may include three or more filters. This enables the carrier aggregation using three or more frequency bands.

A tuning range of the tunable filter TF1 at least partially overlaps at least one of the pass bands of the filters FIL1 and FIL2. The tunable filter TF1 corresponds to a tunable filter circuit of the present disclosure.

Figure 2:
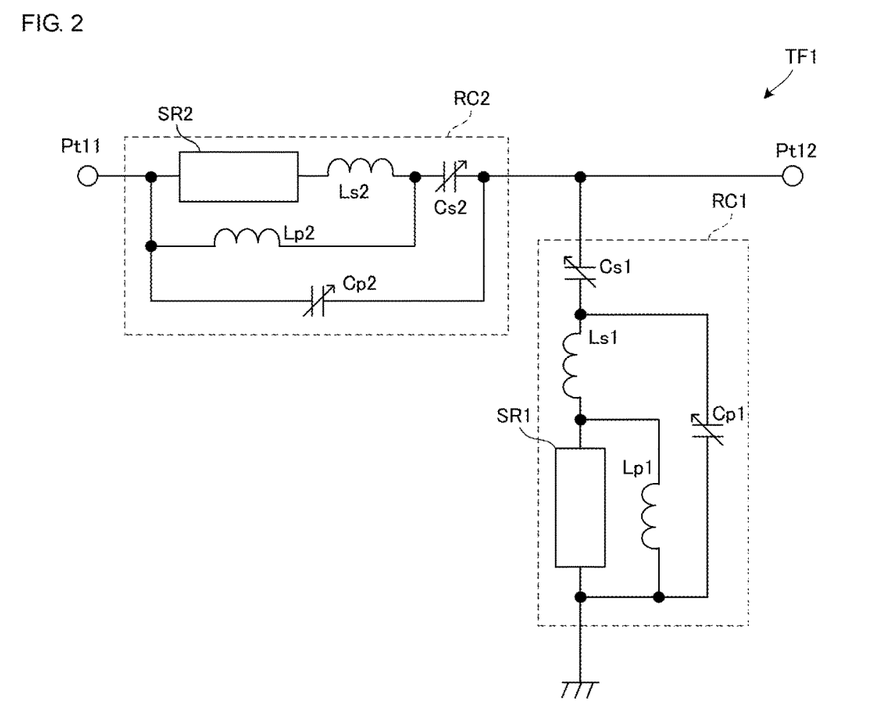
FIG. 2 is a circuit diagram of a tunable filter TF1.

FIG. 2 is a circuit diagram of the tunable filter TF1. The tunable filter TF1 includes a resonator circuit RC1 and a resonator circuit RC2. The resonator circuit RC2 is connected to a signal line between a terminal Pt11 and a terminal Pt12. The resonator circuit RC1 is connected to the terminal Pt12 at one end portion and to ground at the other end portion.

In between terminals of the resonator circuit RC1, a resonator SR1, an inductor Ls1, and a variable capacitor Cs1 are sequentially connected in series from the ground side. An inductor Lp1 is connected in parallel to the resonator SR1. A capacitor Cp1 is connected in parallel to the resonator SR1 and the inductor Ls1 that are connected in series.

The resonator SR1 is an element whose impedance characteristic includes a resonant point (resonant frequency) and an anti-resonant point (anti-resonant frequency). Specifically, the resonator SR1 is a piezoelectric resonator composed of, for example, a surface acoustic wave (SAW) device. The resonator SR1 may alternatively be a bulk acoustic wave (BAW) device (bulk elastic wave resonator).

As variable capacitor elements that can be used as the variable capacitors Cs1 and Cp1, for example, a variable capacitor diode, a variable capacitor element of micro electro mechanical system (MEMS) type, a variable capacitor using BST ((Ba, Sr)TiO3) ferroelectric layer, and the like may be used.

In between terminals of the resonator circuit RC2, a resonator SR2, an inductor Ls2, and a variable capacitor Cs2 are sequentially connected in series from the terminal Pt11 side. An inductor Lp2 is connected in parallel to the resonator SR2 and the inductor Ls2 that are connected in series. A variable capacitor Cp2 is connected in parallel to the resonator SR2, the inductor Ls2, and the variable capacitor Cs2 that are connected in series. The resonator SR2, the inductors Ls2 and Lp2, and the variable capacitors Cs2 and Cp2 are the same elements as the resonator SR1, the inductors Ls1 and Lp1, and the variable capacitors Cs1 and Cp1, respectively.

The tunable filter TF1 can shift its pass band almost without changing insertion loss within the pass band by combining the resonator circuits RC1 and RC2 and by adjusting the capacitances of the variable capacitors Cp1, Cs1, Cp2, and Cs2. In other words, a tunable band pass filter with low insertion loss can be realized.

In a case that fractional bandwidths of the resonators SR1 and SR2 are amply wider than the tuning range, the inductors Ls1, Lp1, Ls2, and Lp2 may be omitted.

Alternatively, the tunable filter TF1 may be realized by varying a capacitance component of LC filter.

Figure 3:
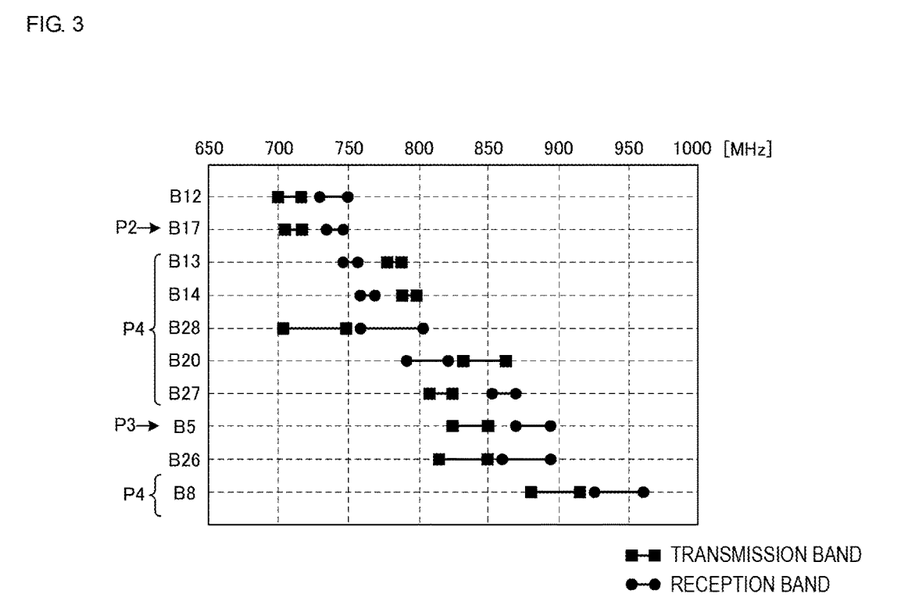
FIG. 3 is a diagram depicting allocation of frequency bands to terminals P2 to P4.

FIG. 3 is a diagram depicting the allocation of the frequency bands to the terminals P2 to P4. The frequency bands depicted in FIG. 3 are defined by Long Term Evolution (LTE) communication standards. For example, frequency band 17 is allocated to the terminal P2, frequency band 5 is allocated to the terminal P3, and frequency bands 13, 14, 28, 20, 27, and 8 are allocated to the terminal P4.

In this case, the frequency bands 17 and 5 are used for the carrier aggregation. The bandpass characteristic of the filter FIL1 meets the specifications required for the frequency band 17. The bandpass characteristic of the filter FIL2 meets the specifications required for the frequency band 5. The tuning range of the tunable filter TF1 includes a range of about 740 MHz to 960 MHz.

Here, the frequency band of the frequency band 12 includes the frequency band of the frequency band 17. Thus, the bandpass characteristic of the filter FIL1 may be made to meet the specifications required for the frequency band 12. The frequency band of the frequency band 26 includes the frequency band of the frequency band 5. Thus, the bandpass characteristic of the filter FIL2 may be made to meet the specifications required for the frequency band 26.

The allocation of the frequency bands is not limited to the above. For example, the frequency bands 8, 20, and the like may be allocated to the terminals P2 and P3. In other words, a combination of the frequency bands 8 and 20 or the like may be used for the carrier aggregation.

A case in which the branching device 10 (see FIG. 1) is used for transmission is described. In a case that the carrier aggregation is carried out, the common terminal Ps11 of the switch SW1 is connected to the individual terminal Ps12 of the switch SW1. A transmitting signal of the frequency band 17 (see FIG. 3) inputted from the terminal P2 and a transmitting signal of the frequency band 5 inputted from the terminal P3 are outputted to the terminal P1. This enables simultaneous transmission at the frequency bands allocated to the terminals P2 and P3.

In a case that the carrier aggregation is not carried out, the transmission is performed in the following manner. When the frequency bands 13, 14, 28, 20, 27, and 8 are to be used, the common terminal Ps11 of the switch SW1 is connected to the individual terminal Ps13 of the switch SW1. The bandpass characteristic of the tunable filter TF1 is adjusted in such a way that the bandpass characteristic of the tunable filter TF1 meets the specifications required for a frequency band to be used. Of the frequency bands 13, 14, 28, 20, 27, and 8, a transmitting signal of one predetermined frequency band is inputted from the terminal P4 and outputted to the terminal P1.

When the frequency band 17 or 5 is to be used, the common terminal Ps11 of the switch SW1 is connected to the individual terminal Ps12 of the switch SW1. A transmitting signal of the frequency band 17 inputted from the terminal P2 or a transmitting signal of the frequency band 5 inputted from the terminal P3 is outputted to the terminal P1.

Next, a case in which the branching device 10 is used for reception is described. In the case the carrier aggregation is carried out, the common terminal Ps11 of the switch SW1 is connected to the individual terminal Ps12 of the switch SW1. A received signal including two received signals of the frequency band 17 and the frequency band 5 is inputted from the terminal P1, and the received signal of the frequency band 17 and the received signal of the frequency band 5 are outputted to the terminal P2 and the terminal P3, respectively. This enables simultaneous reception at the frequency bands allocated to the terminals P2 and P3.

In the case that the carrier aggregation is not carried out, the reception is performed in the following manner. When the frequency bands 13, 14, 28, 20, 27, and 8 are to be used, the common terminal Ps11 of the switch SW1 is connected to the individual terminal Ps13 of the switch SW1. The bandpass characteristic of the tunable filter TF1 is adjusted in such a way that the bandpass characteristic of the tunable filter TF1 meets the specifications required for a frequency band to be used. Of the frequency bands 13, 14, 28, 20, 27, and 8, a received signal of one predetermined frequency band is inputted from the terminal P1 and outputted to the terminal P4.

When the frequency bands 17 or 5 are to be used, the common terminal Ps11 of the switch SW1 is connected to the individual terminal Ps12 of the switch SW1. A received signal at either the frequency band 17 or the frequency band 5 is inputted from the terminal P1. The received signal of the frequency band 17 is outputted to the terminal P2. The received signal of the frequency band 5 is outputted to the terminal P3.

The tunable filter needs to achieve plural kinds of bandpass characteristic at the cost of attenuation at attenuation band, steepness, and the like, compared with the filter whose bandpass characteristic is fixed. This makes it difficult to design a tunable filter having better filter characteristics, compared with the filter whose bandpass characteristic is fixed. Accordingly, there is a possibility that the tunable filter cannot meet a bandpass characteristic of filter required for the carrier aggregation.

In the first embodiment, the filter FIL1 and the filter FIL2 are used simultaneously in the case that the carrier aggregation is carried out, as described above. In the case that the carrier aggregation is not carried out, the tunable filter TF1, or the filters FIL1, and FIL2 is used. The filters FIL1 and FIL2 each have the fixed bandpass characteristic, and can meet desired filter bandpass characteristics for the carrier aggregation. This allows the realization of the branching device 10 that is frequency tunable and compatible with the carrier aggregation. Furthermore, the branching device 10 does not need a plurality of tunable filters. This allows the simplification of control or circuit configuration of the branching device 10.

Figure 4:
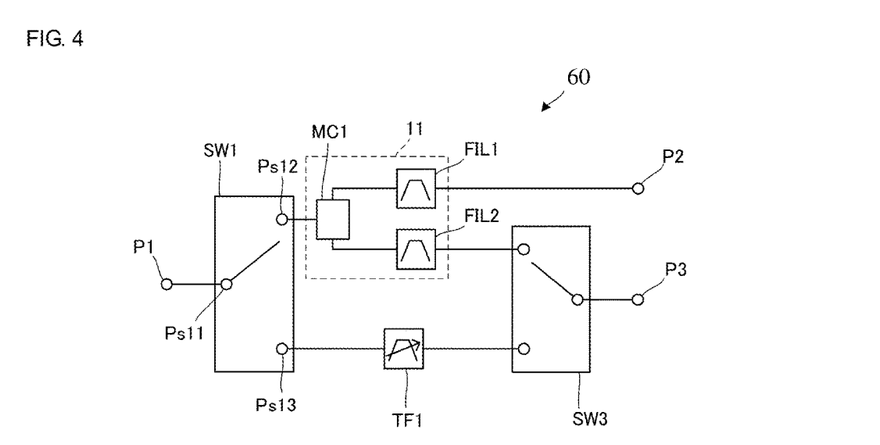
FIG. 4 is a circuit diagram of a branching device 60 according to the first embodiment.

Alternatively, the branching device according to the first embodiment of the present disclosure may be configured as in FIG. 4. FIG. 4 is a circuit diagram of a branching device 60. In the branching device 60, individual terminals of a switch SW3 are respectively connected to the filter FIL2 and the tunable filter TF1, and a common terminal of the switch SW3 is connected to the terminal P3.

In the branching device 60, an input/output terminal of the filter FIL2 and an input/output terminal of the tunable filter TF1 are put together at the switch SW3. In other words, an input/output terminal of a fixed filter compatible with the carrier aggregation and an input/output terminal of the tunable filter that is not compatible with the carrier aggregation are put together at the switch SW3. This allows the branching device 60 to decrease the number of terminals, compared with the branching device 10.

<<Second Embodiment>>

Figure 5:
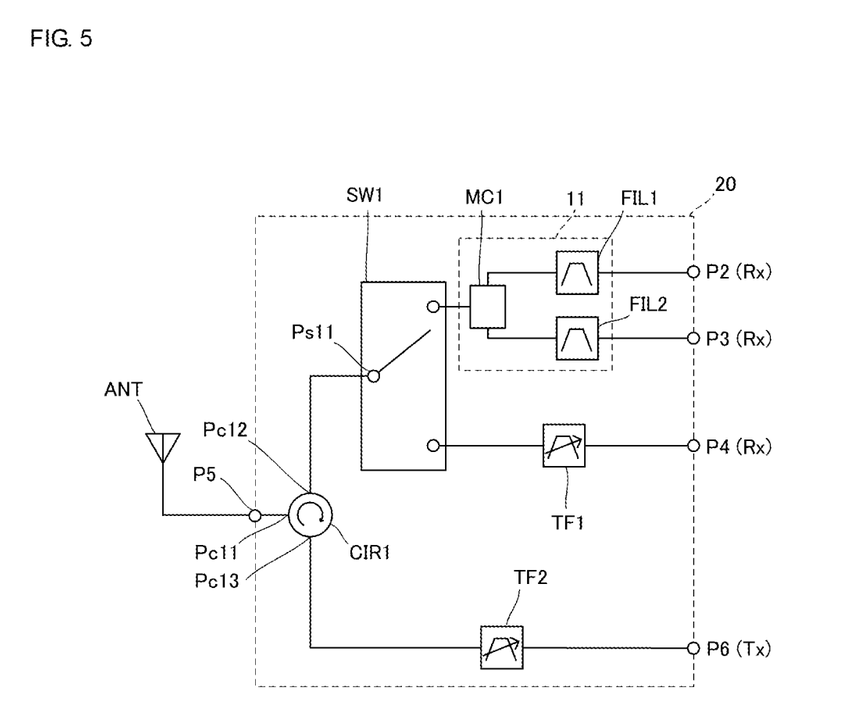
FIG. 5 is a circuit diagram of a branching device according to a second embodiment.

A branching device 20 according to the second embodiment of the present disclosure is now described. FIG. 5 is a circuit diagram of the branching device 20. The branching device 20 includes a circulator CIR1, a tunable filter TF2, and terminals P5 and P6. The circulator CIR1 corresponds to a second circulator of the present disclosure.

The circulator CIR1 includes terminals Pc11 to Pc13. A signal inputted from a terminal Pc11 of the circulator CIR1 is outputted to a terminal Pc12 of the circulator CIR1. A signal inputted from a terminal Pc13 of the circulator CIR1 is outputted to the terminal Pc11 of the circulator CIR1.

The terminal Pc11 of the circulator CIR1 is connected to an antenna ANT via the terminal P5. The terminal Pc12 of the circulator CIR1 is connected to the common terminal Ps11 of the switch SW1. The terminal Pc13 of the circulator CIR1 is connected to a terminal P6 via the tunable filter TF2. The terminals P2 to P4 are connected to the reception control unit (not illustrated). The terminal P6 is connected to the transmission control unit (not illustrated). The remaining configuration is similar to the configuration of the first embodiment. As is the case with the first embodiment, the terminal P2 or P3 and the terminal P4 may be put together using a switch.

In a case that the branching device 20 is used for transmission, the bandpass characteristic of the tunable filter TF2 is adjusted in such a way that the bandpass characteristic of the tunable filter TF2 meets the specifications required for a frequency band to be used. A transmitting signal is inputted from the terminal P6 and outputted to the antenna ANT. In a case that the branching device 20 is used for reception, similar operations are performed as in the first embodiment. In other words, in the case that the carrier aggregation is carried out, the fixed filter circuit 11 is used. In the case that the carrier aggregation is not carried out, the tunable filter TF1 or the fixed filter circuit 11 is used depending on the frequency band to be used. In the branching device 20, the transmission side and the reception side are isolated by the circulator CIR1, thereby enabling simultaneous transmission and reception.

The second embodiment allows the realization of the branching device 20 that is frequency tunable and compatible with the carrier aggregation only at the reception side. Furthermore, effects similar to those in the first embodiment may be obtained.

<<Third Embodiment>>

Figure 6:
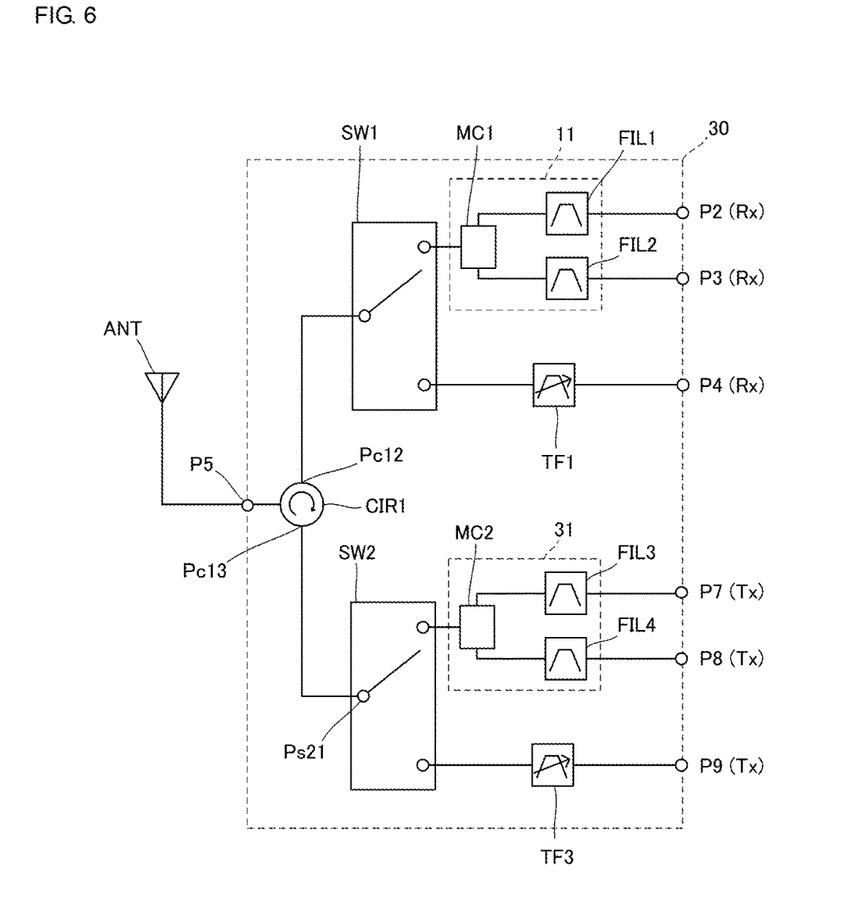
FIG. 6 is a circuit diagram of a branching device according to a third embodiment.

A branching device 30 according to the third embodiment of the present disclosure is now described. FIG. 6 is a circuit diagram of the branching device 30. The branching device 30 includes a switch SW2, a fixed filter circuit 31, a tunable filter TF3, and terminals P7 to P9. The fixed filter circuit 31 includes filters FIL3 and FIL4 and a matching circuit MC2.

The switch SW2, the fixed filter circuit 31, the tunable filter TF3, and the terminals P7 to P9 are configured similarly as in the first embodiment. A common terminal Ps21 of the switch SW2 is connected to the terminal Pc13 of the circulator CIR1. The terminals P7 to P9 are connected to a transmission control unit. The remaining configuration is similar to the second embodiment. In other words, a circuit on the transmission side (terminal Pc13 side of the circulator CIR1) and a circuit on the reception side (terminal Pc12 side of the circulator CIR1) are similarly configured. The circulator CIR1 corresponds to a third circulator of the present disclosure.

As is the case with the first embodiment, the terminal P2 or P3 and the terminal P4 may be put together using a switch. In other words, one of reception side terminals compatible with the carrier aggregation and a reception side terminal not compatible with the carrier aggregation may be put together using a switch. Furthermore, the terminal P7 or P8 and the terminal P9 may be put together using a switch. In other words, one of transmission side terminals compatible with the carrier aggregation and a transmission side terminal not compatible with the carrier aggregation may be put together using a switch.

In a case that the branching device 30 is used for transmission, the transmission is performed similarly as in the first embodiment using the transmission side circuit. In other words, when carrying out the transmission with the carrier aggregation, the fixed filter circuit 31 is used. When the transmission is carried out without the carrier aggregation, one of the tunable filter TF3, the filter FIL3, and the filter FIL4 is used depending on the frequency band to be used. In a case that the branching device 30 is used for reception, reception is performed similarly as in the first embodiment using the reception side circuit. In other words, when carrying out the reception with the carrier aggregation, a fixed filter circuit 11 is used. When carrying out the reception without the carrier aggregation, one of a tunable filter TF1, a filter FIL1, and a filter FIL2 is used depending on the frequency band to be used. In the branching device 30, the transmission side and the reception side are isolated by the circulator CIR1, thereby enabling the simultaneous transmission and reception. Particularly, the carrier aggregation can be carried out at the transmission side and the reception side simultaneously.

Figure 7:
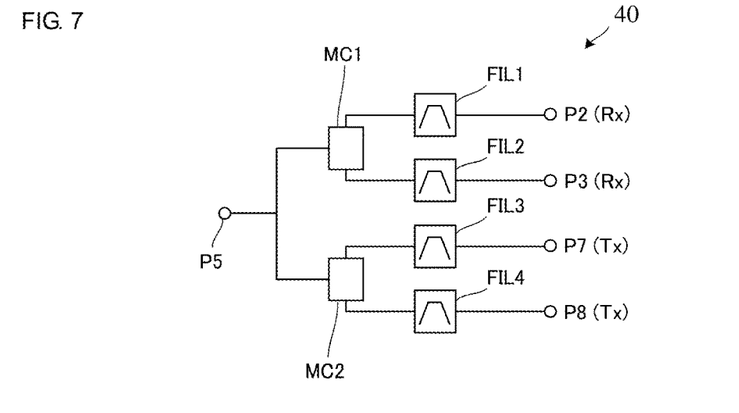
FIG. 7 is a circuit diagram of a branching device that serves as a comparison example.

FIG. 7 is a circuit diagram of a branching device 40 that serves as a comparison example. The branching device 40 includes filters FIL1 to FIL4, matching circuits MC1 and MC2, and terminals P2, P3, P5, P7, and P8. The terminal P5 is connected to the terminal P2 via the filter FIL1, and to the terminal P3 via the filter FIL2. The terminal P5 is connected to the terminal P7 via the filter FIL3, and to the terminal P8 via the filter FIL4. The matching circuit MC1 is connected between the terminal P5 and the filters FIL1 and FIL2. The matching circuit MC2 is connected between the terminal P5 and the filters FIL3 and FIL4.

The terminal P5 is connected to an antenna (not illustrated). The terminals P2 and P3 are connected to a reception control unit (not illustrated). The terminals P7 and P8 are connected to a transmission control unit (not illustrated). Frequency bands to be used in the carrier aggregation are allocated to the terminals P2, P3, P7, and P8.

In the branching device 40, for example, to output to the terminal P2 a received signal of a frequency band included in the frequency range of the pass band of the filter FIL1, the filter FIL2 side needs to be nearly open at a frequency within the pass band of the filter FIL1 when the filter FIL2 side is seen from the terminal P5 via the matching circuit MC1, and the side of the filters FIL3 and FIL4 needs to be nearly open at a frequency within the pass band of the filter FIL1 when the side of the filters FIL3 and FIL4 is seen from the terminal P5 via the matching circuit MC2. The same applies to the filter FIL2 as to the filter FIL1.

Furthermore, for example, to output a transmitting signal inputted from the terminal P7 to the terminal P5, the side of the filters FIL1 and FIL2 needs to be nearly open at a frequency within the pass band of the filter FIL3 when the side of the filter FIL1 and FIL2 is seen from the filter FIL3 side via the matching circuits MC1 and MC2, and the filter FIL4 side needs to be nearly open at a frequency within the pass band of the filter FIL3 when the filter FIL4 side is seen from the filter FIL3 side via the matching circuit MC2. The same applies to the filter FIL4 as to the filter FIL3.

However, it is difficult to meet all conditions for the filters FIL1 to FIL4 simultaneously because of frequency characteristics of the filters. As a result, for example, the impedance on the filter FIL2 side may decrease at a frequency within the pass band of the filter FIL1 in some case. In such a case, a received signal in the frequency band allocated to the terminal P2 leaks to the terminal P3, degrading the isolation characteristic between the terminal P2 and the terminal P3.

In the branching device 30 (see FIG. 6), the transmission side and the reception side are isolated by the circulator CIR1. Thus, when seeing from the terminal P5, what is needed is that the filter FIL2 side be nearly open at a frequency within the pass band of the filter FIL1, and the filter FIL1 side be nearly open at a frequency within the pass band of the filter FIL2. Furthermore, when the filter FIL4 side is seen from the filter FIL3 side via the matching circuit MC2, what is needed is that the filter FIL4 side be nearly open at a frequency within the pass band of the filter FIL3. Furthermore, when the filter FIL3 side is seen from the filter FIL4 side via the matching circuit MC2, what is needed is that the filter FIL3 side be nearly open at a frequency within the pass band of the filter FIL4. As a result, the branching device 30 may achieve better characteristics, compared with the branching device 40.

The third embodiment allows, as described above, the realization of the branching device 30 that is frequency tunable and compatible with the carrier aggregation at the transmission side and the reception side. Furthermore, effects similar to those in the first embodiment may be obtained.

<<Fourth Embodiment>>

Figure 8:
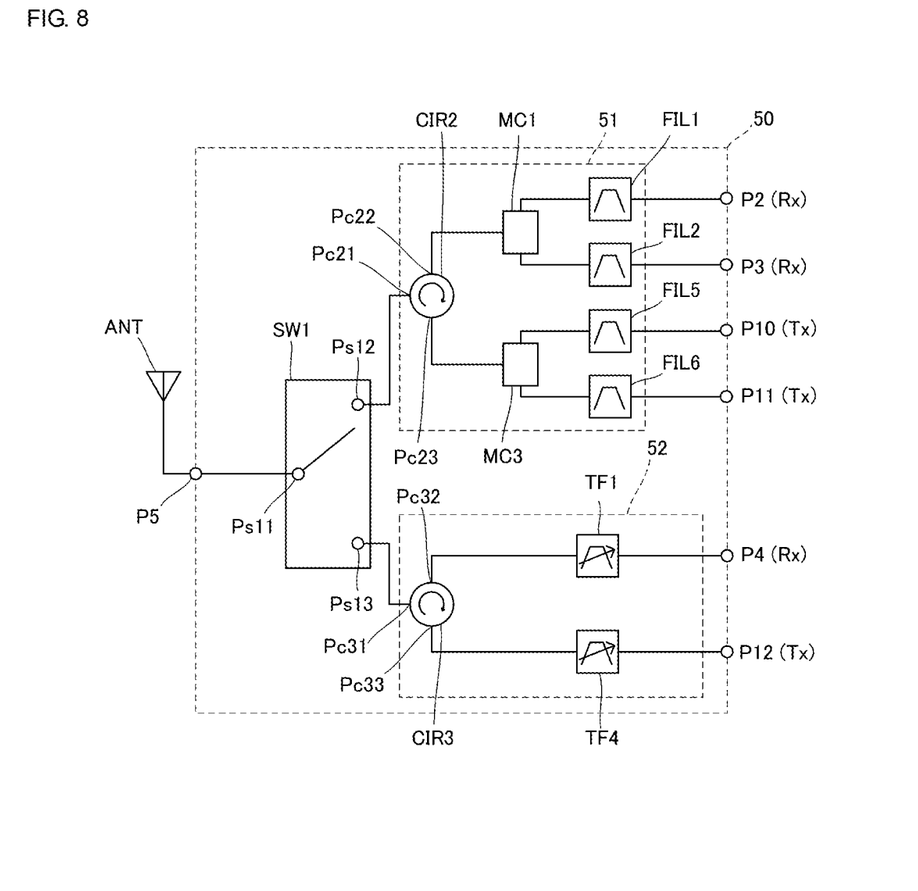
FIG. 8 is a circuit diagram of a branching device according to a fourth embodiment.

A branching device 50 according to the fourth embodiment of the present disclosure is now described. FIG. 8 is a circuit diagram of the branching device 50. The branching device 50 includes a fixed filter circuit 51, a tunable filter circuit 52, and terminals P10 to P12.

The common terminal Ps11 of the switch SW1 is connected to the terminal P5. The individual terminal Ps12 of the switch SW1 is connected to the terminals P2 and P3 and the terminals P10 and P11 via the fixed filter circuit 51. The individual terminal Ps13 of the switch SW1 is connected to the terminals P4 and P12 via the tunable filter circuit 52.

The terminal P5 is connected to the antenna. The terminals P2 to P4 are connected to a reception control unit (not illustrated). The terminals P10 to P12 are connected to a transmission control unit (not illustrated). Frequency bands to be used in the carrier aggregation are allocated to the terminals P2, P3, P10, and P11. Preset frequency bands other than the frequency bands to be used in the carrier aggregation are allocated to the terminals P4 and P12.

The fixed filter circuit 51 includes a circulator CIR2, filters FIL1, FIL2, FIL5, and FIL6, and matching circuits MC1 and MC3. The circulator CIR2 corresponds to a first circulator of the present disclosure. The filters FIL1 and FIL2 correspond to first filters of the present disclosure. The filters FIL5 and FIL6 correspond to second filters of the present disclosure. The circulator CIR2 includes terminals Pc21 to Pc23. A signal inputted from the terminal Pc21 of the circulator CIR2 is outputted to the terminal Pc22 of the circulator CIR2. A signal inputted from the terminal Pc23 of the circulator CIR2 is outputted to the terminal Pc21 of the circulator CIR2. The frequency range of the pass band of the circulator CIR2 may only need to include the frequency bands to be used in the carrier aggregation.

The terminal Pc21 of the circulator CIR2 is connected to the individual terminal Ps12 of the switch SW1. The terminal Pc22 of the circulator CIR2 is connected to the matching circuit MC1. The filters FIL5 and FIL6 and the matching circuit MC3 are connected between the terminal Pc23 of the circulator CIR2 and the terminals P10 and P11 as is the case with the terminal Pc22 side of the circulator CIR2. The remaining configuration of the fixed filter circuit 51 is similar to the configuration of the fixed filter circuit 11 (see FIG. 1).

The tunable filter circuit 52 includes a circulator CIR3 and tunable filters TF1 and TF4. The circulator CIR3 includes terminals Pc31 to Pc33. A signal inputted from the terminal Pc31 of the circulator CIR3 is outputted to the terminal Pc32 of the circulator CIR3. A signal inputted from the terminal Pc33 of the circulator CIR3 is outputted to the terminal Pc31 of the circulator CIR3.

The terminal Pc31 of the circulator CIR3 is connected to the individual terminal Ps13 of the switch SW1. The terminal Pc32 of the circulator CIR3 is connected to the terminal P4 via the tunable filter TF1. The terminal Pc33 of the circulator CIR3 is connected to the terminal P12 via the tunable filter TF4.

In a case that the carrier aggregation is carried out at transmission and reception, the common terminal Ps11 of the switch SW1 is connected to the individual terminal Ps12 of the switch SW1. Transmitting signals are inputted from the terminal P10 and P11 and outputted to the antenna ANT. Of received signals received at the antenna ANT, a received signal at the frequency band allocated to the terminal P2 (or terminal P3) is outputted to the terminal P2 (or terminal P3). In this way, the carrier aggregation may be carried out using two frequency bands. Furthermore, because the transmission side and the reception side are isolated by the circulator CIR1, the carrier aggregation may be performed at the transmission side and the reception side simultaneously.

In a case that the carrier aggregation is not carried out at the transmission and reception, the transmission and reception is carried out as follows. When carrying out transmission using the terminal P12 and reception using the terminal P4, the common terminal Ps11 of the switch SW1 is connected to the individual terminal Ps13 of the switch SW1. The bandpass characteristics of the tunable filters TF1 and TF4 are adjusted in such a way that the bandpass characteristics of the tunable filters TF1 and TF4 meet the specifications required for frequency bands to be used. A transmitting signal is inputted from the terminal P12 and outputted to the antenna ANT. A received signal at the frequency band to be used is received at the antenna ANT and outputted to the terminal P4.

When carrying out transmission using the terminal P10 or P11 and reception using the terminal P2 or P3, the common terminal Ps11 of the switch SW1 is connected to the individual terminal Ps12 of the switch SW1. At the time of transmission, a transmitting signal inputted from the terminal P10 or P11 is outputted from the common terminal Ps11 of the switch SW1 via the filter FIL5 or FIL6. At the time of reception, a received signal inputted from the common terminal Ps11 of the switch SW1 is outputted from the terminal P2 or P3 via the filter FIL1 or FIL2.

In the branching device 50, the transmission side and the reception side are isolated by the circulator CIR3, and this enables the simultaneous transmission and reception.

The fourth embodiment allows, as described above, the realization of the branching device 50 that is frequency tunable and compatible with the carrier aggregation at the transmission side and the reception side. Furthermore, the transmission side and the reception side are isolated by the circulators CIR2 and CIR3. Therefore, the branching device 50 can achieve better characteristics, compared with the branching device 40 (see FIG. 7). Furthermore, effects similar to those in the first embodiment may be obtained.

In the foregoing embodiments, examples are described in which the switch SW1 or SW2 is used for branching. Alternatively, the branching may be achieved by using a diplexer, which uses an inductor and a capacitor, and the like.

ANT Antenna
CIR1 Circulator (second circulator, third circulator)
CIR2 Circulator (first circulator)
CIR3 Circulator
Cp1, Cs1, Cp2, Cs2 Variable capacitor
FIL1, FIL2 Filter (first filter)
FIL3, FIL4 Filter
FIL5, FIL6 Filter (second filter)
Lp1, Ls1, Lp2, Ls2 Inductor
MC1-MC3 Matching circuit P1-P12, Pc11-Pc13, Pc21-Pc23, Pc31-Pc33, Pt11, Pt12 Terminal
Ps11, Ps21 Common terminal
Ps12 Individual terminal (first individual terminal)
Ps13 Individual terminal (second individual terminal)
RC1, RC2 Resonator circuit
SR1, SR2 Resonator
SW1, SW2, SW3 Switch
TF1 Tunable filter (tunable filter circuit)
TF2-TF4 Tunable filter
10-60 Branching device
11, 31, 51 Fixed filter circuit
52 Tunable filter circuit

The invention claimed is:

1. A branching device comprising:
a switch including a common terminal, a first individual terminal, and a second individual terminal;
a fixed filter circuit connected to the first individual terminal and having a fixed pass band; and
a tunable filter circuit connected to the second individual terminal and having a tunable pass band, wherein
the fixed filter circuit includes a plurality of filters having different pass bands,
the pass bands of the plurality of filters correspond to frequency bands used in carrier aggregation,
if carrier aggregation is carried out, the common terminal is connected to the fixed filter circuit through the first individual terminal, and
if carrier aggregation is not carried out, the common terminal is connected to the tunable filter circuit through the second individual terminal.

2. The branching device according to claim 1, wherein the fixed filter circuit includes a matching circuit connected between the plurality of filters and the first individual terminal.

3. The branching device according to claim 2, wherein a pass band of at least one of the plurality of filters at least partially overlaps the tunable pass band of the tunable filter circuit.

4. The branching device according to claim 2, wherein the fixed filter circuit includes a first circulator,
the plurality of filters include a plurality of first filters and a plurality of second filters, and
each of the first filters and each of the second filters are connected to different terminals of the first circulator.

5. The branching device according to claim 2, wherein the common terminal is connected to an antenna via a second circulator.

6. A branching device comprising:
two branching devices according to claim 2, wherein
the common terminal of each of the two branching devices is connected to a different terminal of a third circulator and connected to an antenna via the third circulator.

7. The branching device according to claim 2, wherein the tunable filter circuit includes a piezoelectric resonator and a variable reactance element.

8. The branching device according to claim 1, wherein a pass band of at least one of the plurality of filters at least partially overlaps the tunable pass band of the tunable filter circuit.

9. A branching device comprising:
two branching devices according to claim 8, wherein
the common terminal of each of the two branching devices is connected to a different terminal of a third circulator and connected to an antenna via the third circulator.

10. The branching device according to claim 8, wherein the fixed filter circuit includes a first circulator,
the plurality of filters include a plurality of first filters and a plurality of second filters, and
each of the first filters and each of the second filters are connected to different terminals of the first circulator.

11. The branching device according to claim 8, wherein the common terminal is connected to an antenna via a second circulator.

12. The branching device according to claim 8, wherein the tunable filter circuit includes a piezoelectric resonator and a variable reactance element.

13. The branching device according to claim 1, wherein the fixed filter circuit includes a first circulator,
the plurality of filters include a plurality of first filters and a plurality of second filters, and
each of the first filters and each of the second filters are connected to different terminals of the first circulator.

14. The branching device according to claim 13, wherein the common terminal is connected to an antenna via a second circulator.

15. The branching device according to claim 13, wherein the tunable filter circuit includes a piezoelectric resonator and a variable reactance element.

16. A branching device comprising:
two branching devices according to claim 13, wherein
the common terminal of each of the two branching devices is connected to a different terminal of a third circulator and connected to an antenna via the third circulator.

17. The branching device according to claim 1, wherein the common terminal is connected to an antenna via a second circulator.

18. The branching device according to claim 17, wherein the tunable filter circuit includes a piezoelectric resonator and a variable reactance element.

19. A branching device comprising:
two branching devices according to claim 1, wherein
the common terminal of each of the two branching devices is connected to a different terminal of a third circulator and connected to an antenna via the third circulator.

20. The branching device according to claim 1, wherein the tunable filter circuit includes a piezoelectric resonator and a variable reactance element.

* * * * *